United States Patent
Hillmer et al.

(10) Patent No.: US 6,208,793 B1
(45) Date of Patent: Mar. 27, 2001

(54) WAVELENGTH-TUNABLE OPTOELECTRONIC APPARATUS

(75) Inventors: Hartmut Hillmer, Kassel; Bernd Klepser, Meiningen, both of (DE)

(73) Assignee: Deutsche Telekom AG, Bonn (DE)

(*) Notice: Subject to any disclaimer, the term of this patent is extended or adjusted under 35 U.S.C. 154(b) by 0 days.

(21) Appl. No.: 09/380,432

(22) PCT Filed: Jan. 26, 1998

(86) PCT No.: PCT/DE98/00225

§ 371 Date: Dec. 10, 1999

§ 102(e) Date: Dec. 10, 1999

(87) PCT Pub. No.: WO98/38711

PCT Pub. Date: Sep. 3, 1998

(30) Foreign Application Priority Data

Mar. 1, 1997 (DE) .............................. 197 08 385

(51) Int. Cl.[7] ...................................... G02B 6/10
(52) U.S. Cl. ............................ 385/131; 385/24; 372/43; 372/50
(58) Field of Search ................... 372/20, 43, 46, 372/50, 102; 385/37, 131, 24

(56) References Cited

U.S. PATENT DOCUMENTS 5,052,015  9/1991  Ackerman .

FOREIGN PATENT DOCUMENTS

| | | |
|---|---|---|
| 3643361 | 6/1987 | (DE) . |
| 44 32 410 | 3/1996 | (DE) . |
| 0 559 192 | 9/1993 | (EP) . |
| 0 641 053 | 3/1995 | (EP) . |
| 0 732 785 | 9/1996 | (EP) . |
| 2 417 866 | 9/1979 | (FR) . |
| 05343789 | 12/1993 | (JP) . |

OTHER PUBLICATIONS

K. Sato et al., Experimental Investigation of Thermal Crosstalk in a Distributed Feedback Laser Array, IEEE Phot. Technol. Lett., vol. 3, pp. 501–503 (1991).

C.E. Zah et al., Low Threshold and High–Speed 1·5 μm Compressive–Strained Multiquantum Well Four–Wavelength Distributed–Feedback Laser Arrays, Electron. Lett., vol. 27, pp. 1040–1041 (1991).

S. Murata et al., Frequency–tunable Semiconductor Lasers, Optical and Quantum Electronics, vol. 22, pp. 1–15 (1990).

K. Dutta et al., Electronically Tunable Distributed Feedback Lasers, Appl. Phys. Lett. vol. 48, pp. 1501–1503 (1986).

(List continued on next page.)

*Primary Examiner*—Cassandra Spyrou
*Assistant Examiner*—Euncha Cherry
(74) *Attorney, Agent, or Firm*—Kenyon & Kenyon

(57) ABSTRACT

The present invention provides an optoelectronic apparatus operating on different wavelength channels, such that the individual wavelength channels are individually variable in wavelength. The optoelectronic apparatus may be based on multisectioning of at least one bent waveguides is realized in one embodiment of the present invention by at least one isolation trench over the bent waveguide, the trench having a resistance of at least 10 ohms between a first and second individual section, wherein the first and the second sections can be supplied with an individual control current. The arrangement and depth of the at least one isolation trench corresponds with the bend of the at least one bent waveguides, wherein a bending function $y_i(x)$ of the at least one bent waveguide is determined according to model calculation-assisted optimizations.

20 Claims, 11 Drawing Sheets

OTHER PUBLICATIONS

M. Kuznetsov, Design of Widely Tunable Semiconductor Three–Branch Lasers, J. Lightw. Technol. vol. 12, pp. 2100–2106 (1994).

Y. Tohmori et al., Broad–Range Wavelength–Tunable Superstructure Grating (SSG) DBR Lasers, IEEE J. Quantum Electron. vol. 29, pp. 1817–1823 (1993).

K. Sato et al., Simultaneous Operation of Ten–Channel Tunable DFB Laser Arrays Using Strained–InGaAsP Multiple Quantum Wells, IEEE J. Quantum Electronics, vol. 29, pp. 1805–1809 (1993).

H. Yasaka et al., Optical Frequency Spacing Tunable Four–Channel Integrated 1.55 $\mu$m Multielectrode Distributed–Feedback Laser Array, IEEEE Phot. Technol. Lett. vol. 1, pp. 75–76 (1989).

Y. Katoh et al., $7^{th}$ Int'l Conference on Indium Phosphide and Related Materials 1995, Four–Wavelength DBR Laser Array with Waveguide–Couplers Fabricated Using Selective MOVPE Growth, Technical Digest WA 1.4 pp. 26–28.

K. Kato et al., $7^{th}$ Int'l Conference on Indium Phosphide and Related Materials 1995, High–speed Waveguide Photodetectors, Technical Digest WA 1.4 pp. 349–352.

Li et al., 16–Wavelength Gain–Coupled DFB Laser Array with Fine Tunability, IEEE Photon. Technol. Lett. vol. 8, pp. 22–24 (1996).

Lo et al., Four Channel Integrated DFB Laser Array with Tunable Wavelength Spacing and 40–Gb/s Signal Transmission Capacity, J. Lightwave Technology, vol. 11,pp. 619–623 (1993).

W.T. Tsang et al., Control of Lasing Wavelength in Distributed Feedback Lasers by Angling the Active Stripe with Respect to the Grating, IEEE Photon. Technol. Lett. vol. 5, pp. 978–980 (1993).

Kogelnik, Coupled–Wave Theory of Distributed Feedback Lasers, J. Appl. Phys., vol. 43, pp. 2327–2335 (1972).

H. Hillmer et al., Appl. Phys. Lett. 65, 2130 (1994)**.

Hilmer etal., "Tailored DFB Laser Properties by Individually Chirped Gratings Using Bent Waveguides," IEEE Journal of Selected Topics in Quantum Electronics, Jun. 1995, No. 2, pp. 356–362**.

Hillmer, "Novel tunable semiconductor lasers using continuously chirped distributed feedback gratings with ultrahigh spatial precision," 320 Applied Physics Letters, 65 (1994) Oct. 24, No. 17, pp. 2130–2132**.

WAVELENGTH-TUNABLE OPTOELECTRONIC APPARATUS

FIELD OF THE INVENTION

The present invention relates, to wavelength-tunable lasers, laser arrays and laser lines.

RELATED TECHNOLOGY

There are numerous publications and patents in the field of fixed-frequency/fixed-wavelength laser arrays. See for examples:

C. E. Zah, et al., Electron. Lett. 27, 1041 (1991), and

Furthermore, wavelength-tunable multi-section components have been used. See,

S. Murata et al., Optical and Quantum Electronics 22, 1 (1990);

K. Dutta et al., Appl. Phys. Lett. 48, 1501 (1986);

M. Kuznetsov, J. Lightw. Technol. 12, 2100 (1994); and

Y. Tohmori et al., IEEE J. Quantum Electron. 29, 1817 (1993).

Design approaches which are based on a semiconductor component having laterally adjacent multi-section DFB lasers. In such designs, wavelength is tuned by the individual injection of current into the sections of each laser of the laser array. A disadvantage of this component is that the range of wavelength tuning is very small. See, incorporated by reference herein, K. Sato et al., IEEE J. Quantum Electronics 29, 1805 (1993); and H. Yasaka et al., IEEE Phot. Technol. Lett. 1, 75 (1989).

Further design approaches are based on a semiconductor component having laterally adjacent multi-section DBR lasers. In this case, wavelength was tuned by the individual injection of current into the sections of each laser of the laser array. See, incorporated by reference herein, Digest WA 1.4.

Another design approach is based on a laser array in which each individual laser can be thermally tuned using a thin metallic-film resistance heater. See, incorporated by the reference herein, Li, et al., IEEE Photon. Technol. Lett. 8, 22 (1996); and Lo et al., J. Lightwave Technology 11, 619 (1993).

It is also known to use tilted waveguides on homogeneous DFB grating sections which define an effective grating period in the waveguide. The effective grating period correlates with the grating period of the homogeneous grating and with the tilt angle of the grating $\phi$. See, incorporated by reference herein, M. A. Diforte, FR-A-2 417 866 (1978);

W. T. Tsang et al., IEEE Photon. Technol. Lett. %, 978 (1993); and

W. T. Tsang, EP 0 641 053 A1.

The calculation of the mode structure and of the threshold current density, i.e. the definition of the bending functions of the waveguides, is carried out with the aid of model calculations based, for instance, on the theory of coupled modes. See, incorporated by reference herein, K. Kogelnik and C. V. Shank, J. Appl. Phys. 43, 2327 (1972).

Bent waveguides on homogeneous DFB grating sections can be used to define gratings with axially varied grating periods. See, incorporated by reference herein, Shoji et al., DE 3643361 A1, (1987); and D. A. Ackerman, U.S. Pat. No. 5,052,015 (1991).

Three-section lasers with DFB gratings having axially varied grating period are described in the following incorporated by reference herein, H. Ishii, EP 0 559 192 A2 (1993);

H. Hillmer et al., Appl. Phys. Lett. 65, 2130 (1994).

German Patent No. DE-A-44 32 410, incorporated by reference herein, describes an optoelectronic component having a single bent waveguide. The bend in the waveguide is used to produce a phase shift.

In Hillmer H. et. al, "Tailored DFB Laser Properties by Individually Chirped Gratings Using Bent Waveguides", IEEE Journal of Selected Topics in Quantum Electronics, vol.1, no. 2, Jun. 1, 1995, pages 356–362, incorporated by reference herein, an optoelectronic component having a single bent waveguide is described. The sectioning, the different control currents and the waveguide bend are used to tune the wavelength.

SUMMARY OF THE INVENTION

An object of the present invention is an optoelectronic apparatus which operates on different wavelength channels whose wavelengths can be individually varied. Apparatus, i.e., components of this kind play a key role in wavelength multiplexing techniques when working with fiber-optic data transmission. Such optoelectronic components may, for example, be in the form of laser arrays, laser lines, amplifier arrays and filter arrays. An object of the present invention is to develop a structure for an optoelectronic component having the aforementioned characteristics.

An optoelectronic component array designed according to the invention serves a maximum of n channels whose characteristic wavelengths are individually tunable by control currents. Examples of such component arrays are wavelength-tunable laser arrays, wavelength-tunable amplifier arrays, wavelength-tunable filter arrays, wavelength-tunable detector arrays and wavelength-tunable converter arrays. Each individual channel corresponds to an individually bent optical waveguide. For each of these optical waveguides, an individual function $y_i(x)$ defines the course of the maximum of the conducted light field in the xy plane, i.e. the individual waveguide bends, where i is an integer, in the range $1 \leq i \leq n$. The axial direction i follows the bending of the optical waveguide of ordinal number i, i.e. there is a curved coordinate in the xy plane. In the case of a laser array, each optical waveguide is composed of the laser-active zone 3 and the surrounding materials which, in the xz plane, are distant at most by the lightwave length from the center of the light field. Above or below the xy plane is a feedback grating 4 whose grating lines are tilted with respect to a preferential direction by the tilt angle $\phi$. The grating area is bounded in the x-direction by two boundary surfaces at x=0 and at x=L, these two boundary surfaces being perpendicular to the x-axis. Feedback grating 4 is in an area in which the amount of the intensity of the light field conducted in the optical waveguide is greater than $I_0(x)/100$, $I_0(x)$ being the intensity in the maximum of the light field in the yz plane at position x. For the length of the grating area L in the x-direction, $0.2 \leq K \cdot L \leq 7$ is applicable for the feedback thus achieved, where K is the coupling coefficient of feedback grating 4. Feedback grating 4 is DFB-like (DFB=distributed feedback), DBR-like (DBR=distributed Bragg reflector) or it has a sampled grating. In the last-mentioned case, there are additionally a defined number of grating-free areas in the direction of light propagation. Feedback grating 4 may produce, for example, purely real index coupling, purely imaginary index coupling or complex coupling (real and imaginary coupling). The cross-sectional form of feedback grating 4 (in planes which perpendicularly intersect the xy plane) is either triangular, rectangular or sinusoidal. Suitable mixed forms are also possible, such as a rectangular form with rounded corners. For a homogeneous feedback grating 4 or a homogeneous partial area of a grating, $\Lambda_0$ is the grating period. Wavelength tuning is achieved by the multi-sectioning of each individual optical waveguide, each individual section being pumped with its own control current. Typically, there are two to three sections per optical waveguide, i.e., the emission wavelength of a channel is set using two to three different control currents. In this context, the wavelength of channel i is tunable approximately in the wavelength range $\Delta\lambda_i$. An example of this is a DFB semiconductor laser array emitting from n optical waveguides on n different wavelengths $\lambda_i$, where i runs from 1 to n. In other words, the optoelectronic component is capable of operating simultaneously on n different frequency channels. The wavelength interval $\Delta\lambda_i$ of the waveguide of ordinal number i is preset in its absolute wavelength position by the tilt of the feedback grating (tilt angle ($\phi$), by the grating and by the $\Lambda_0$ of the feedback grating and the corresponding bending function of the optical waveguide $y_i(x)$. Finally, the emission wavelength $\lambda_i$ is fine-tuned by the control currents corresponding to the optical waveguide of ordinal number i. The same applies analogously to the other optical waveguides of the component array. It is possible to precisely set both the absolute wavelengths of the n channels and the wavelength spacings of the individual channels i in relation to each other. This makes it possible, for example, to implement component arrays having equidistant frequency or wavelength spacings for WDM, i.e., wavelength division multiplex, applications.

The angle $\alpha_{li,i}$ describes the angle between the optical waveguide of ordinal number i and the normal onto the component facet at position x=0, (left end of the grating area). The angle $\alpha_{re,i}$ describes the angle between the optical waveguide of ordinal number i and the normal onto the component facet at position x=L, (right end of the grating area). The widths of the optical waveguides may differ, this having an influence on the effective refractive index $N_{\textit{eff},i}$. The left and right grating boundaries (boundary surfaces) shown in the figures stand for directions which are preferred crystallographically or from the standpoint of the component geometry. The boundary surfaces may be cleaved, etched or lithographic grating boundaries, cleaved or etched component boundaries, cleaved semiconductor wafer boundaries or etched boundaries on the semiconductor wafer. If the component does not end at the boundary surfaces, the optical waveguides may continue outside the grating area. There may be branches, combiners, switches, tapers, etc. in the grating-free area. In this case, the area shown in the figures represents a section of an integrated optoelectronic circuit.

For the sake of clarity, the component dimensions, the angles, the waveguide widths, the waveguide bends and the corrugation periods are not shown to scale in the illustrations. Typically, the lateral wavelength width is considerably greater than the grating period in the feedback grating.

BRIEF DESCRIPTION OF THE DRAWINGS

The present invention may be more easily understood with reference to the following figures.

DETAILED DESCRIPTION

The optoelectronic component according to the invention is explained in greater detail with reference to several exemplary embodiments.

Figure 1:
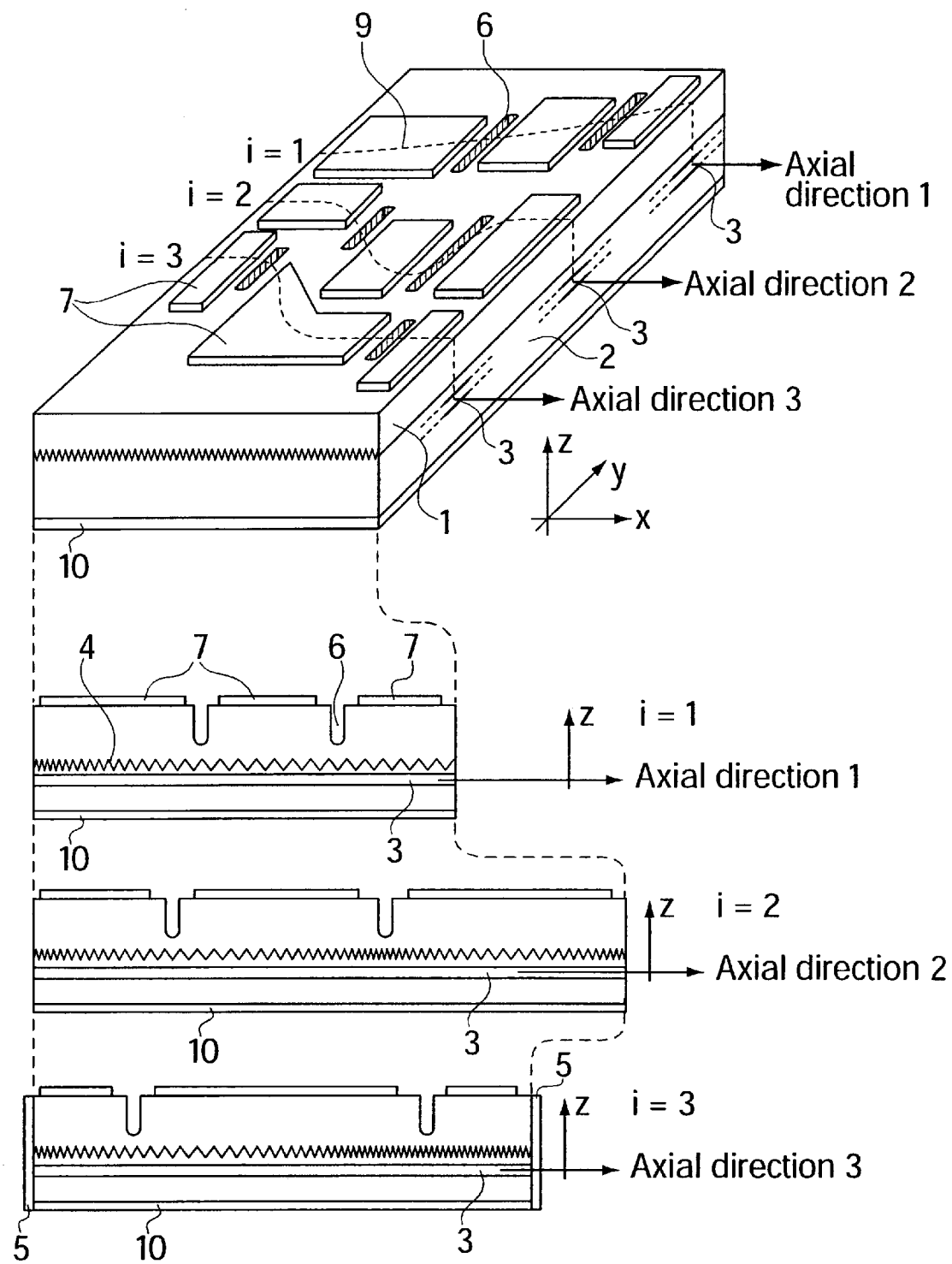
FIG. 1 shows a perspective view as well as three curved sectional views of a first embodiment component array including three differently bent optical waveguides.

FIG. 1 shows the representation of a component array with n=3 differently bent optical waveguides (i=1, 2, 3) in the top part of the figure. The contacting of each individual optical waveguide is interrupted twice, with the result that there are three 3-section components. A cross-section through a feedback grating 4 of the DFB type is visible at the front surface (as viewed in the perspective representation). This feedback grating 4 extends in the xy plane over the entire surface of the component array.

The broken lines 9 indicate the projections of the waveguide centers onto the component surface (parallel to the xy plane). The course of the center of the waveguide of ordinal number i represents the waveguide bend $y_i(x)$. In this sense, curved lines 9 indicate the projections of axial directions i onto the component surface. Furthermore, they indicate to a good approximation the course of the intensity maximum of the conducted light field.

The bottom part of the figure shows three curved sections along the lines 9 through the component array, it being possible in each case to see a feedback grating of the DFB type having an axially differently varied grating period. The z-direction is perpendicular to the xy plane. The axial direction i runs in the xy plane and follows the bend of the optical waveguide of ordinal number i. The cross-section in the curved plane shows: a bulk semiconductor layer 1 of conductivity type I, a bulk semiconductor layer 2 of conductivity type II, an active layer 3, a feedback grating 4, the facet coating 5, the isolation trenches or contact separations 6, the contact pads 7 of the individual sections on the side of conductivity type I and the metallization, or contact layer 10 on the side of conductivity type II. Due to the different bending functions, the three components have different grating-affected optical waveguide lengths along the axial directions. In this example, tilt angle $\phi$ of the feedback grating is very small ($\phi=0.5°$) with respect to a preferential direction. In this application example, feedback grating 4 has a triangular cross-section.

Figure 2:
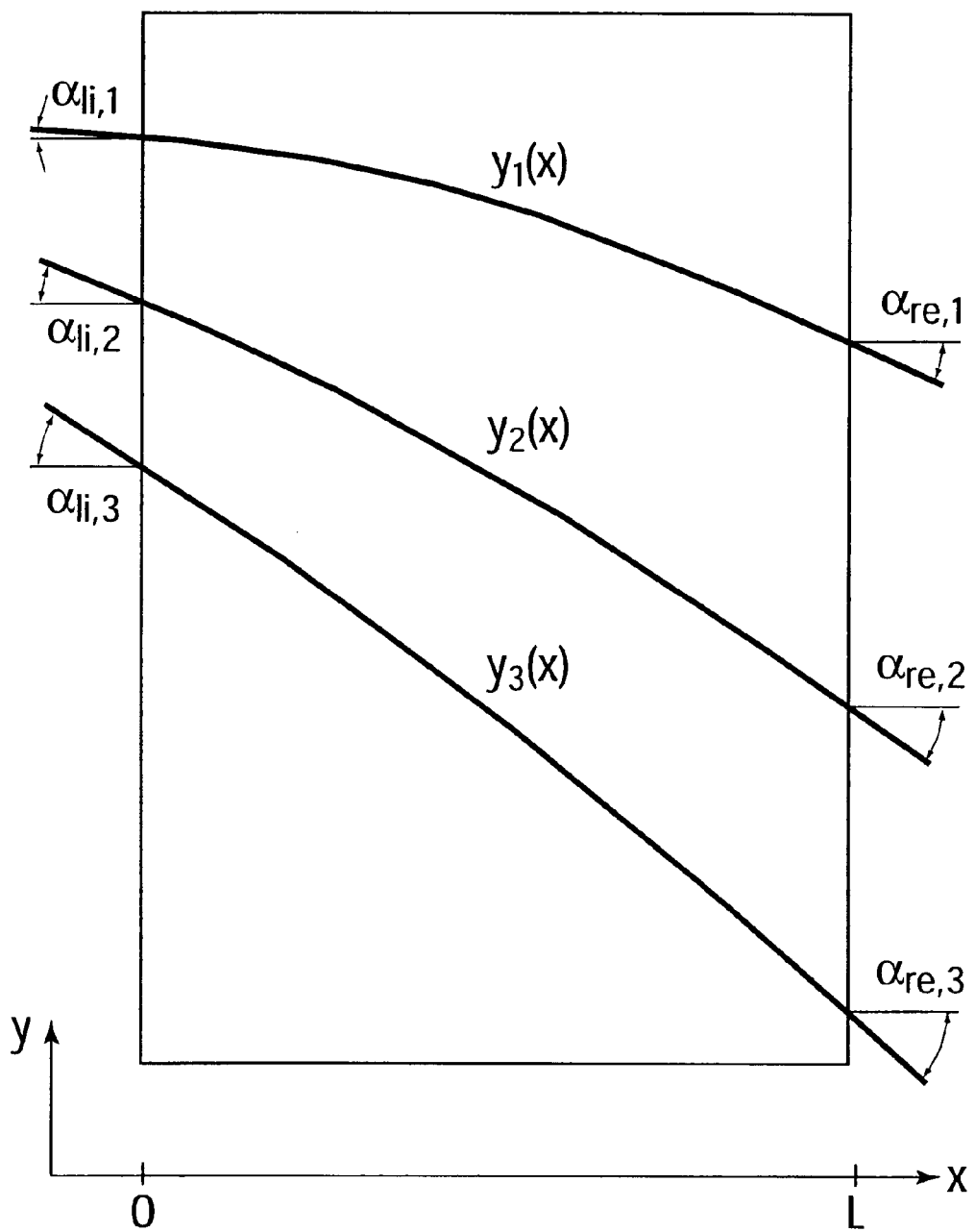
FIG. 2 shows a graphical representation of bending functions of three optical waveguides of a second embodiment component array in an x–y plane.

FIG. 2 shows the representation of the bending functions of three optical waveguides of a further component array in the xy plane. Within the framework of the present design approach according to the invention, the algebraic sign of angles $\alpha$, as shown in FIG. 2, is positive.

Figure 3:
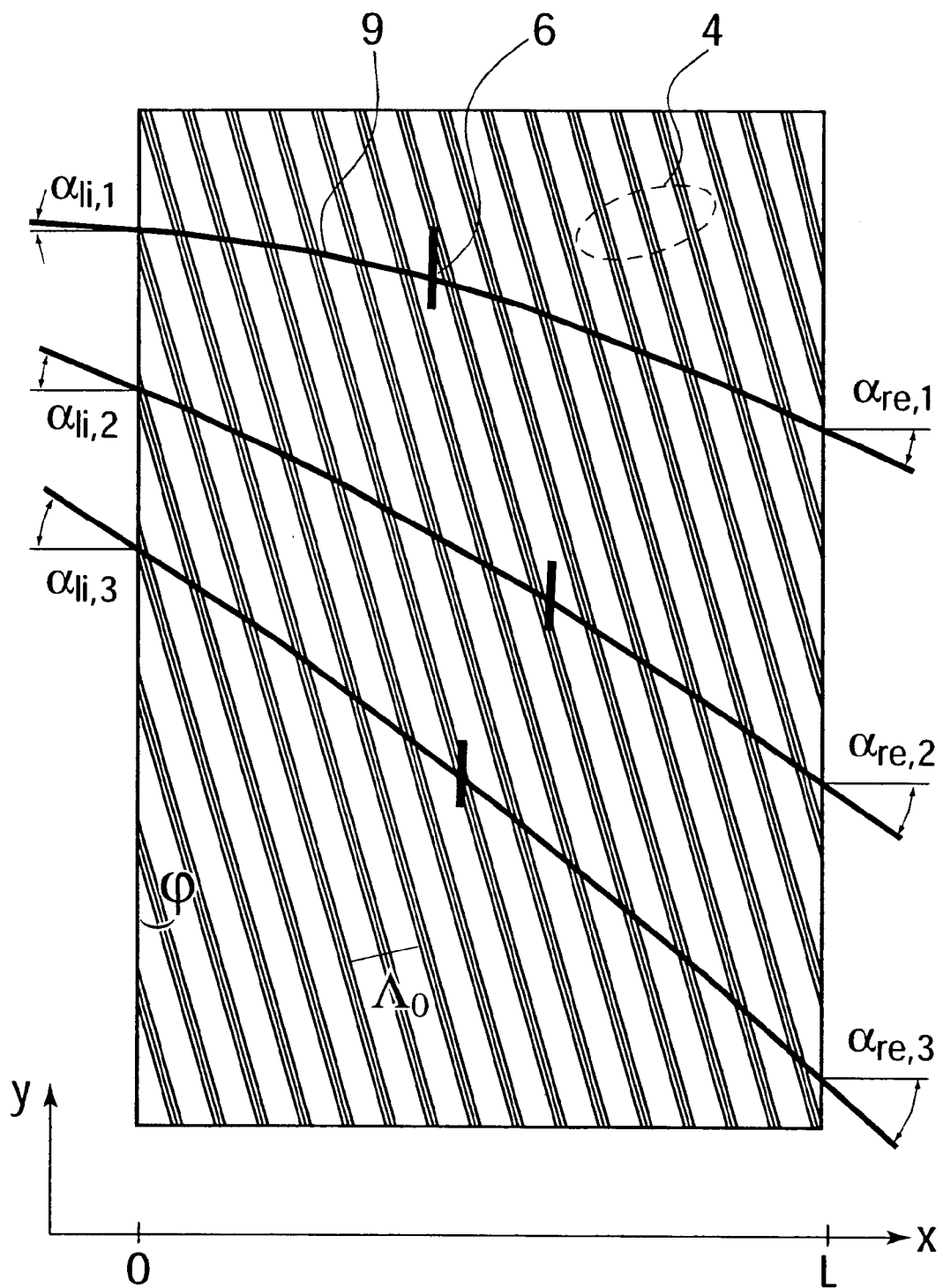
FIG. 3 shows a graphical simultaneous representation of an x–y plane (grating plane) according to the embodiment of FIG. 2.

FIG. 3 shows the simultaneous representation of a further xy plane (grating plane) of the component array shown in FIG. 2. Feedback grating 4 is tilted by tilt angle $\phi$ with respect to a preferential direction. For each optical waveguide, the figure shows the projection of the waveguide center into the xy plane in the form of curved line 9. In this exemplary embodiment, each waveguide is subdivided into two sections by an isolation trench 6. In the present top view, these separations are indicated by black bars, and can be seen at the bottom of FIG. 1 in the three cross-sections as isolation trenches 6. As a result of the separations shown, the component array in this example is composed of three 2-section components.

Figure 4:
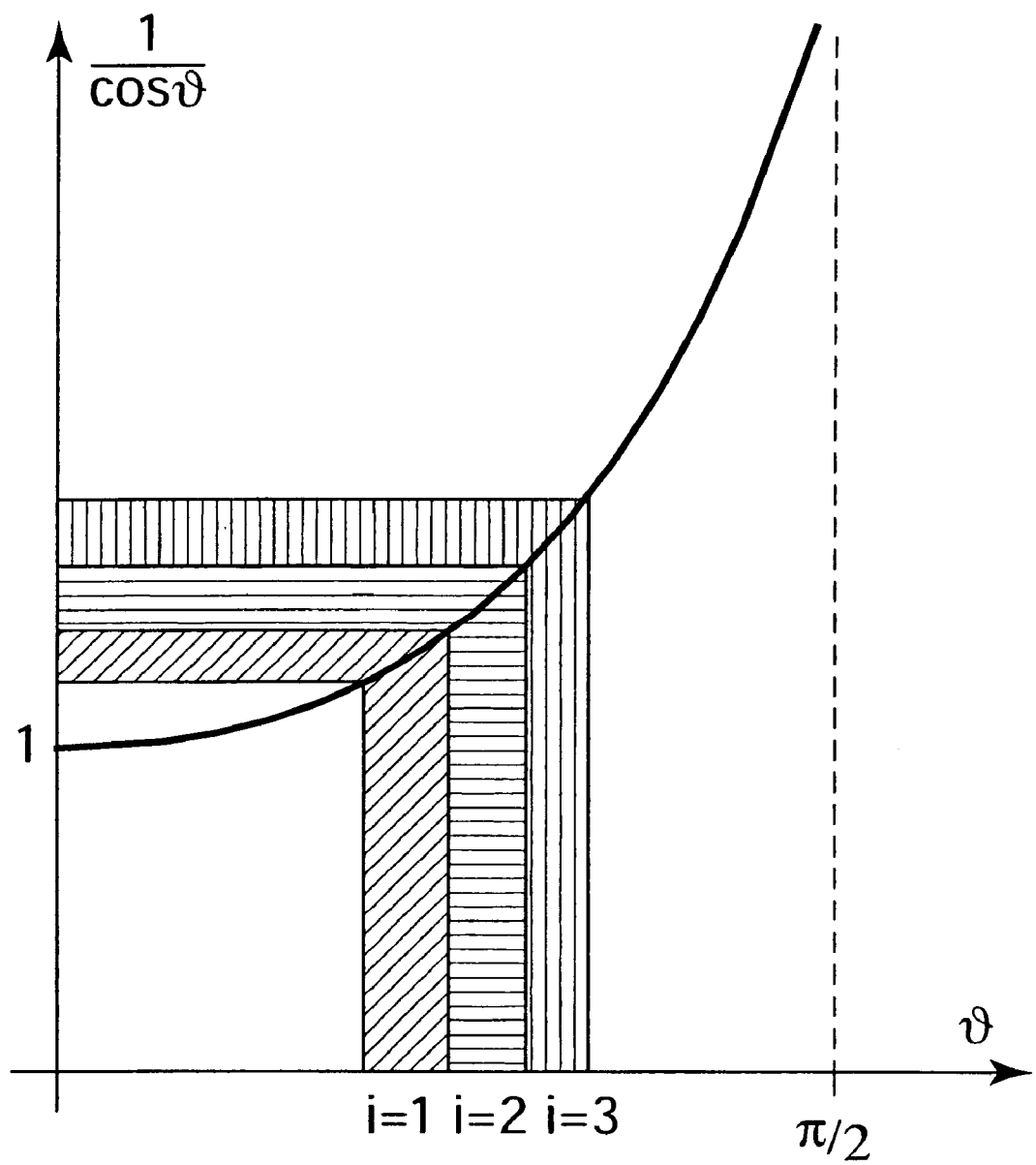
FIG. 4 shows a graphical representation of an effective grating period according to the embodiment of FIG. 2.

Due to the waveguide bending, there is a change, in the axial direction, of the local tilt angle $\vartheta$ of the optical waveguide with respect to feedback grating 4. This changes the effective grating period, available for the light field conducted in the optical waveguide, with respect to grating period $\Lambda_0$ in the feedback grating by the factor of $1/\cos \vartheta$. This is illustrated in FIG. 4. Thus, local tilt angle $\vartheta$ of the optical waveguide varies along the axial direction. For the component array shown in FIGS. 2 and 3, the angular range traversed by the individual waveguides is shown on the $\vartheta$-axis. The ordinate shows that the variation of the grating period is more efficient at larger local tilt angles $\vartheta$ of the optical waveguide, i.e., greater variations in the grating period can be obtained.

Figure 5:
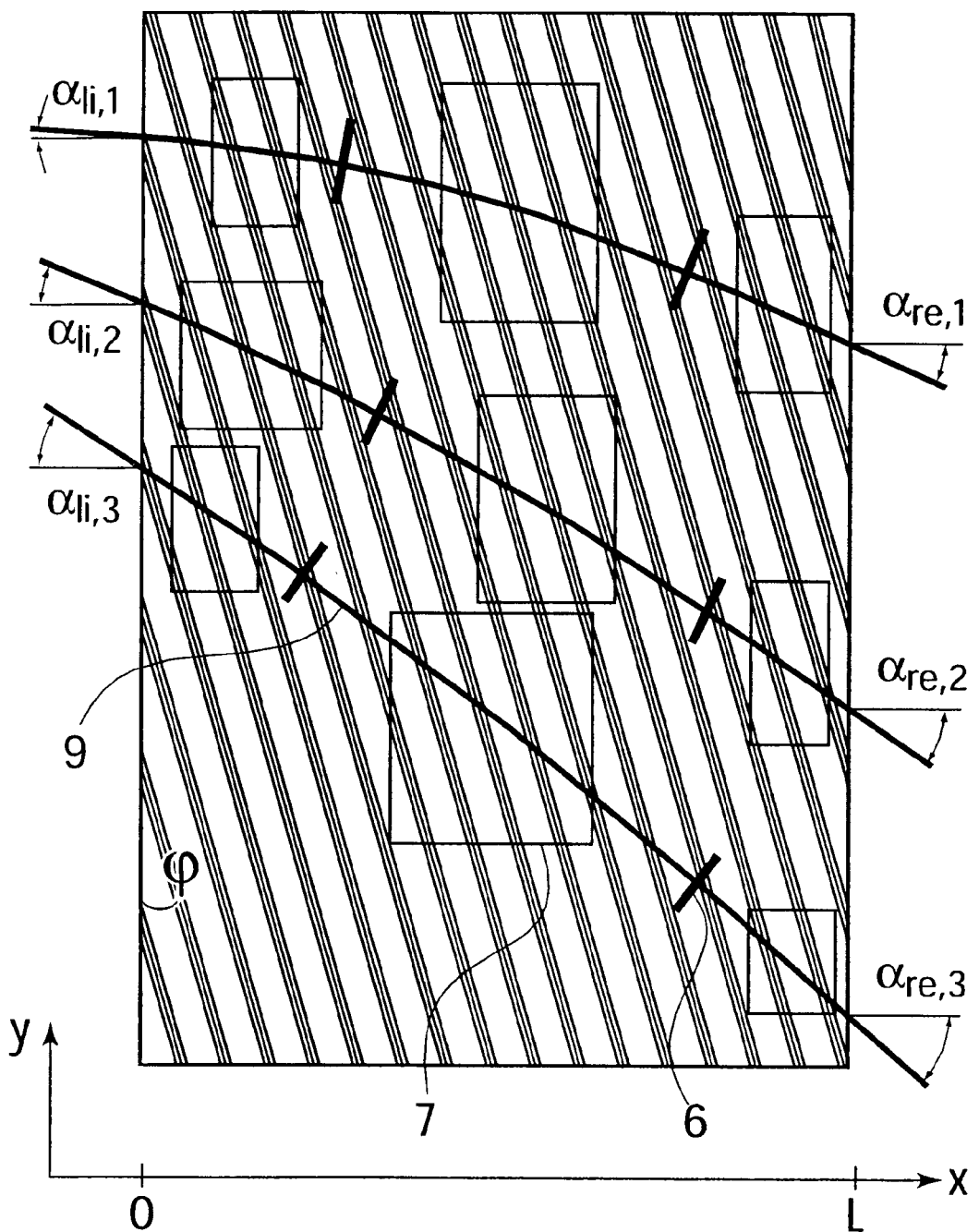
FIG. 5 shows a graphical representation of a third embodiment component array.

FIG. 5 shows the representation of a different component array, based on the bending functions shown in FIG. 2, in which, however, two isolation trenches 6 are allocated to each waveguide. Consequently, the component array in this case has three 3-section components. Each individual section has its own contact pad or bond pad 7. Thus, each section can be controlled by an individual injection current.

Figure 6:
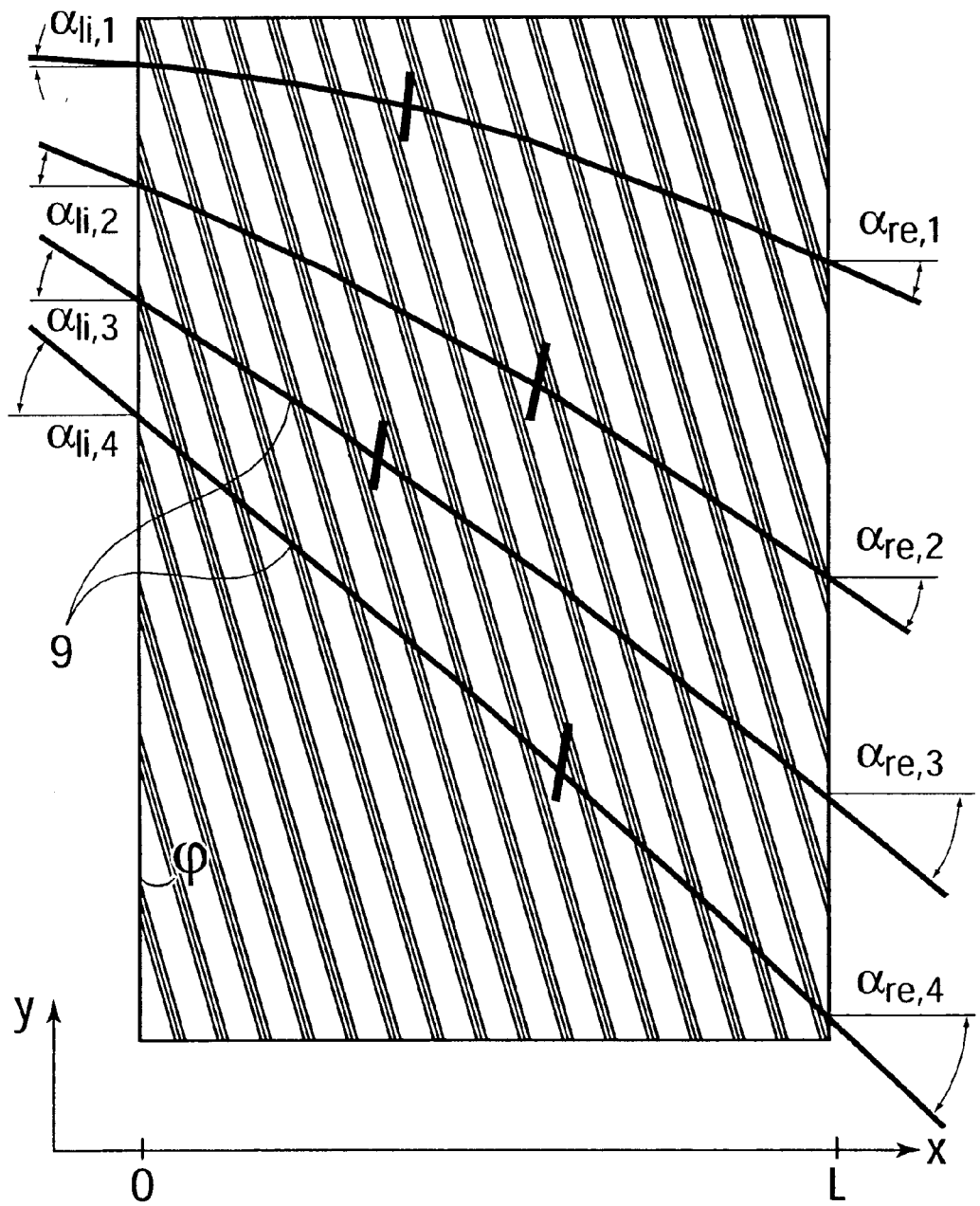
FIG. 6 shows a graphical representation of fourth embodiment component array including four optical waveguides.

FIG. 6 shows the representation of a component array including four optical waveguides, each of which is divided once. In this manner, four 2-section components are formed for this component array.

Figure 7:
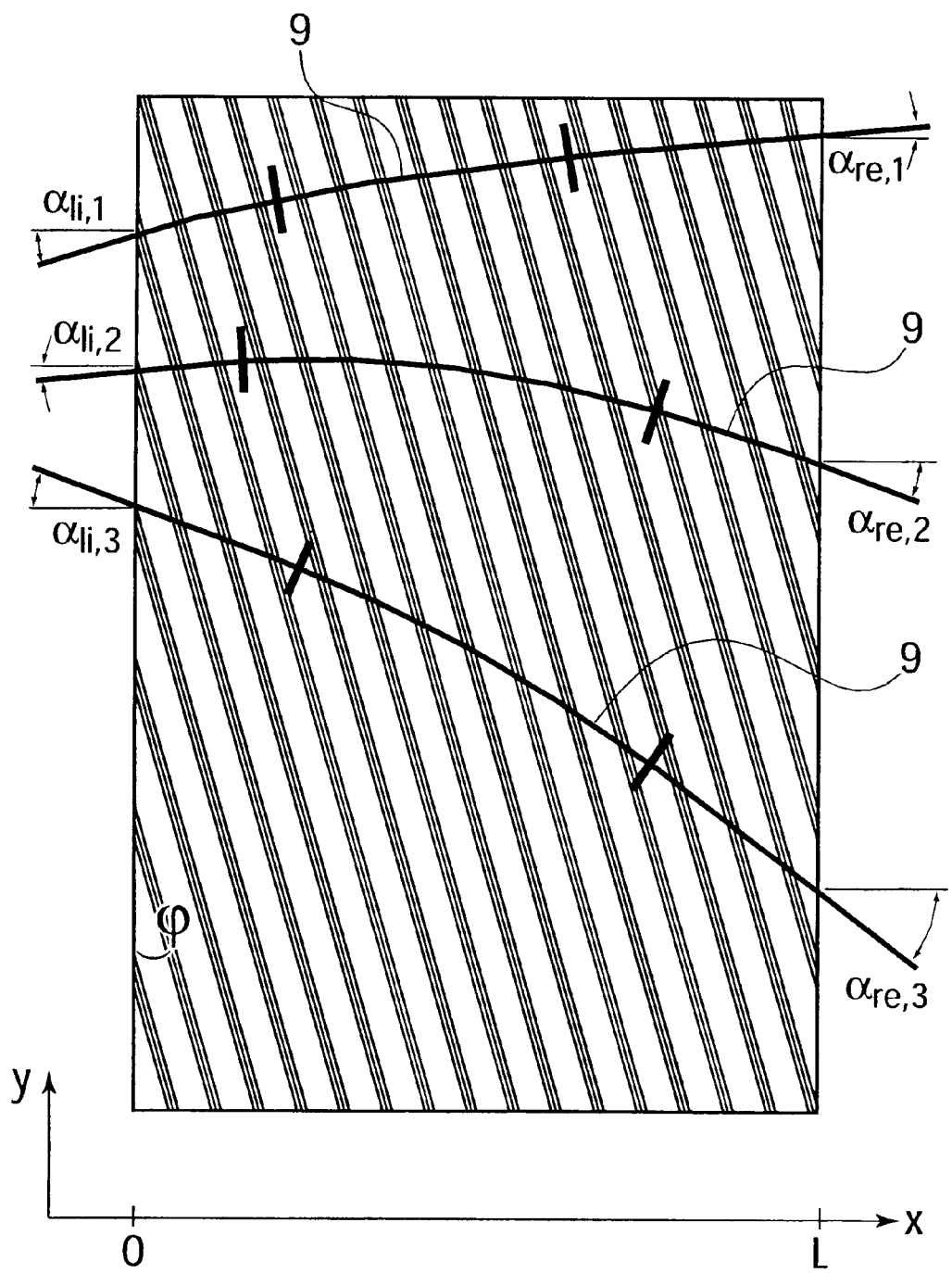
FIG. 7 shows a graphical representation of a fifth embodiment component array including three optical waveguides.

FIG. 7 shows the representation of a component array including three optical waveguides, each of which is divided twice. In the case of this component array, this results in three 3-section components.

Figure 8:
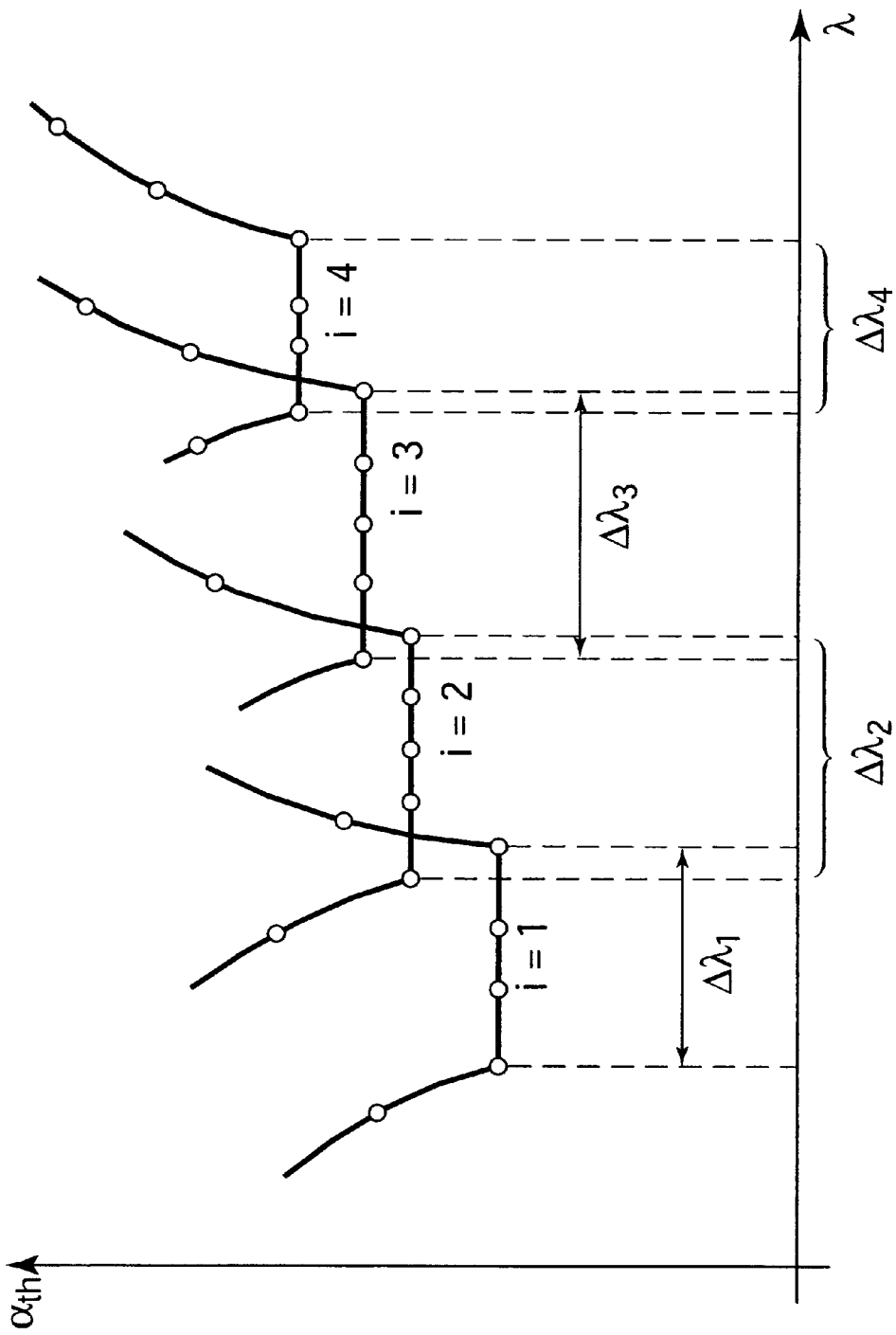
FIG. 8 shows a graphical representation of threshold gain as a function of wavelength for a sixth embodiment component array including four specially bent waveguides.
Figure 9A:
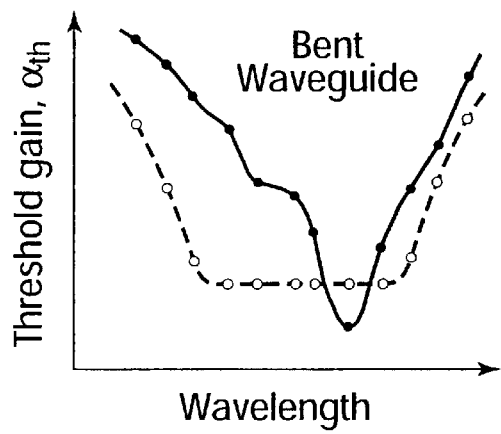
FIGS. 9a–d show graphical representations of threshold gain as a function of wavelength for a seventh embodiment component array.
Figure 9C:
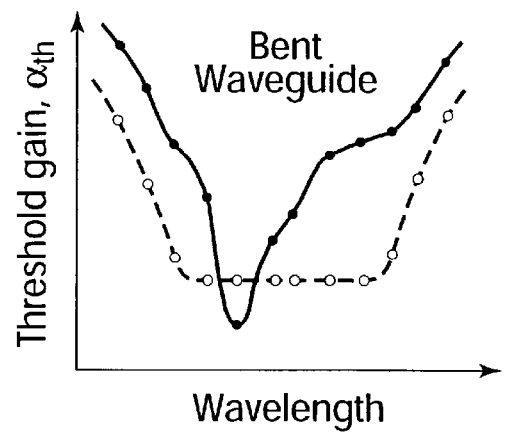
Figure 9B:
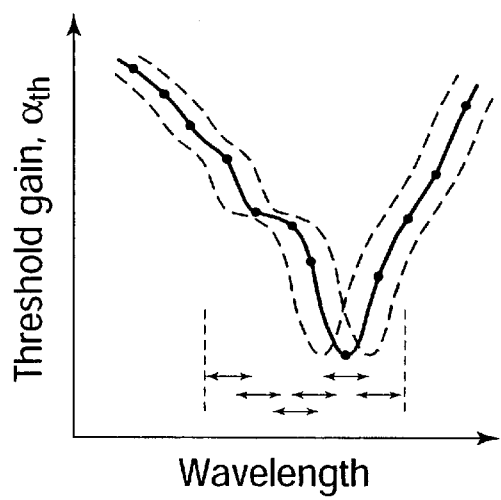
Figure 9D:
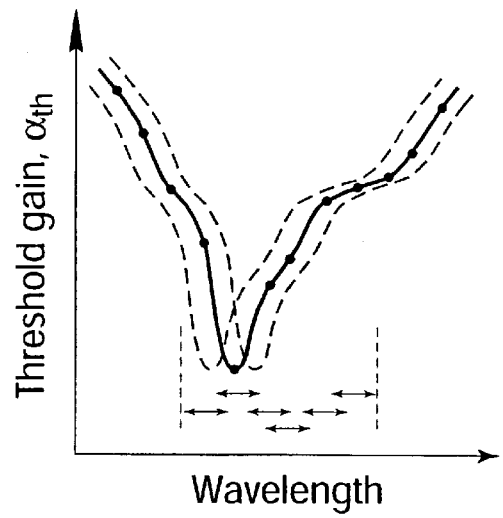
Figure 10A:
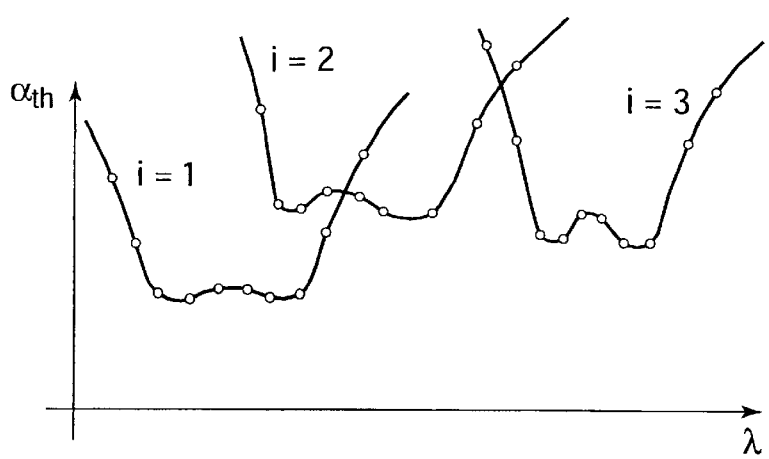
FIGS. 10a–e show graphical representations of threshold gain as a function of wavelength for an eighth embodiment array including three differently bent optical waveguides.
Figure 10B:
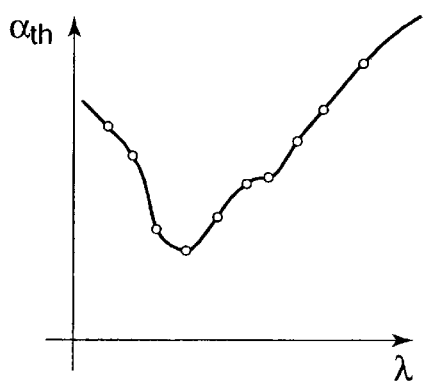
Figure 10D:
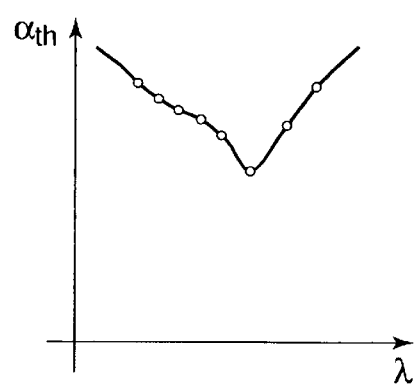
Figure 10C:
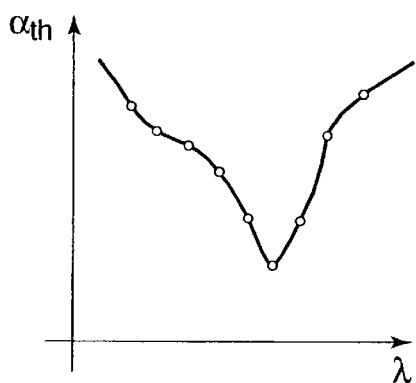
Figure 10E:
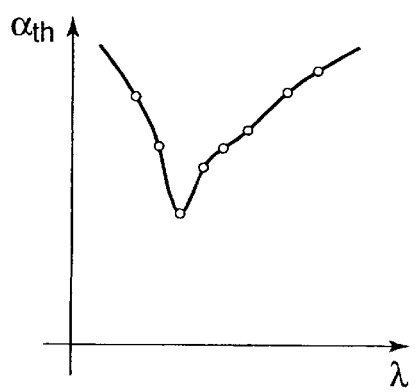

Through a suitable choice of the bending functions of the optical waveguides, it is possible to produce a plurality of spectrally adjacent modes having virtually identical threshold gains $\alpha_{th}j_{i,i}$, where $j_i$ is an integer in the range $1 \leq j_i \leq m_i$. The $m_i$ spectrally adjacent modes of the optical waveguide of ordinal number i extend over the wavelength range $\Delta\lambda_i$. If shorter grating areas of length L and greater bends are chosen, spectrally further extended wavelength ranges $\Delta\lambda_i$ result in which there are spectrally adjacent modes with similar threshold gain. In FIG. 8, such a situation has been realized for a component array by four specially bent waveguides. The wavelength ranges $\Delta\lambda_1$, $\Delta\lambda_2$, $\Delta\lambda_3$ and $\Delta\lambda_4$, with the aid of the geometrical parameters of the bending functions, have been so positioned in their absolute spectral positions that their range limits have only a slight spectral overlap. Furthermore, the bending functions are characterized by $\delta^2 y/\delta x^2 < 0$. With rising x, there is a decreasing behavior of all bending functions $y_i(x)$ of the component array (see e.g., FIG. 6) as well as $\alpha_{li,1} < \alpha_{re,1}$; $\alpha_{re,1} \sim \alpha_{li,2}$; $\alpha_{li,2} < \alpha_{re,2}$;
$\alpha_{re,2} \sim \alpha_{li,3}$; $\alpha_{li,3} < \alpha_{re,3}$ and $\alpha_{re,3} \sim \alpha_{li,4}$.

The principle of wavelength tuning is explained schematically with reference to FIG. 9 for one of the multi-section components of an array. FIG. 9 shows the threshold gain as a function of the wavelength. In FIGS. 9a and 9c, the hollow circles indicate the threshold gains and the spectral positions of the individual modes when the laser component is homogeneously pumped throughout the entire resonator range. The axial variation of the grating period has been so selected in this example that the threshold gains of six spectrally adjacent modes have the same value. These modes are numbered in the following from left to right (j=1, 2, 3, 4, 5, m=6). The broken line serves to guide the eye. In order to address with priority a specific mode among the equivalent modes, use is made of an inhomogeneous current injection suitable for that purpose, i.e., a specific current intensity is selected for the control current of each individual section. In FIG. 9a, the solid circles schematically represent such a specific situation of inhomogeneous current injection that permits a minimum threshold gain for mode j=5, which is thereby specifically addressed. The other modes, which were equivalent under homogeneous current injection of mode j=5, are increased in their threshold gain by this special inhomogeneous current injection. The solid circles indicate the threshold gains and spectral positions of the individual modes when the component is being specifically inhomogeneously pumped throughout the entire resonator range, the solid line serving once again only to guide the eye. In order to tune selected mode j=5, one or two injection currents are suitably varied, this resulting in a wavelength change (tuning) of 1 to 2 nm, which is represented in FIG. 9b by the horizontal, thick double arrow. In response to wavelength tuning, there is primarily a shift of the entire profile, as is shown in FIG. 9b by the two profiles represented by dotted lines. Only secondarily is there a slight deformation of the profile. In order to select and tune another mode, it is necessary to employ a different combination of injection currents, i.e. a different inhomogeneous current-injection profile. Such a situation is represented for the selection of mode j=2 in FIG. 9c by the solid circles. In order to tune mode j=2, once again one or two injection currents are suitably varied, as is schematically indicated by the horizontal double arrow. Corresponding to each of the six equivalent modes is a horizontal double arrow indicating the wavelength tuning of this mode. Consequently, the entire wavelength tuning range of the multi-section DFB laser with specially bent optical waveguide is considerably greater than that of the multi-section DFB laser with straight optical waveguide, as is indicated by the vertical, dotted lines. This wavelength-tuning concept unites, as it were, the tuning ranges of a plurality of multi-section DFB lasers with spectrally closely adjacent wavelengths of the Bragg modes.

This wavelength-tuning principle, demonstrated using one component of an array as an example, is also applied in the figurative sense to the remaining components of the array. The use of bent optical waveguides to produce the special axial variation of the grating period does not, however, result in any additional costs in the technological manufacture of such a tunable component array.

FIG. 10 shows the threshold gain as a function of the wavelength for a different component array having three differently bent optical waveguides (i=1, 2, 3). In this case, the bending functions are so selected that, given axially homogeneous current injection, six spectrally adjacent modes exist per optical waveguide i, said modes exhibiting a similarly small threshold gain. Wavelength ranges $\Delta\lambda_1$, $\Delta\lambda_2$ and $\Delta\lambda_3$, with the aid of the geometrical parameters of the bending functions, have been so positioned in their absolute spectral positions that they spectrally overlap, as in the case i=1 and i=2, or do not overlap, as in the case i=2 and i=3. The top part of the figure shows the case in which current is injected homogeneously in the axial direction into each optical waveguide. Due to inhomogeneous current injection (permitted by multi-sectioning of the optical waveguides), it is possible for individual modes to be selected from the six modes and for their wavelengths to be tuned. For optical waveguides i=1, the mode $j_1=2$ is selected in case (b), the mode $j_1=5$ being selected in case (c). For optical waveguide i=3, the mode $j_3=6$ is selected in case (d), the mode $j_3=3$ being selected in case (e).

Figure 11:
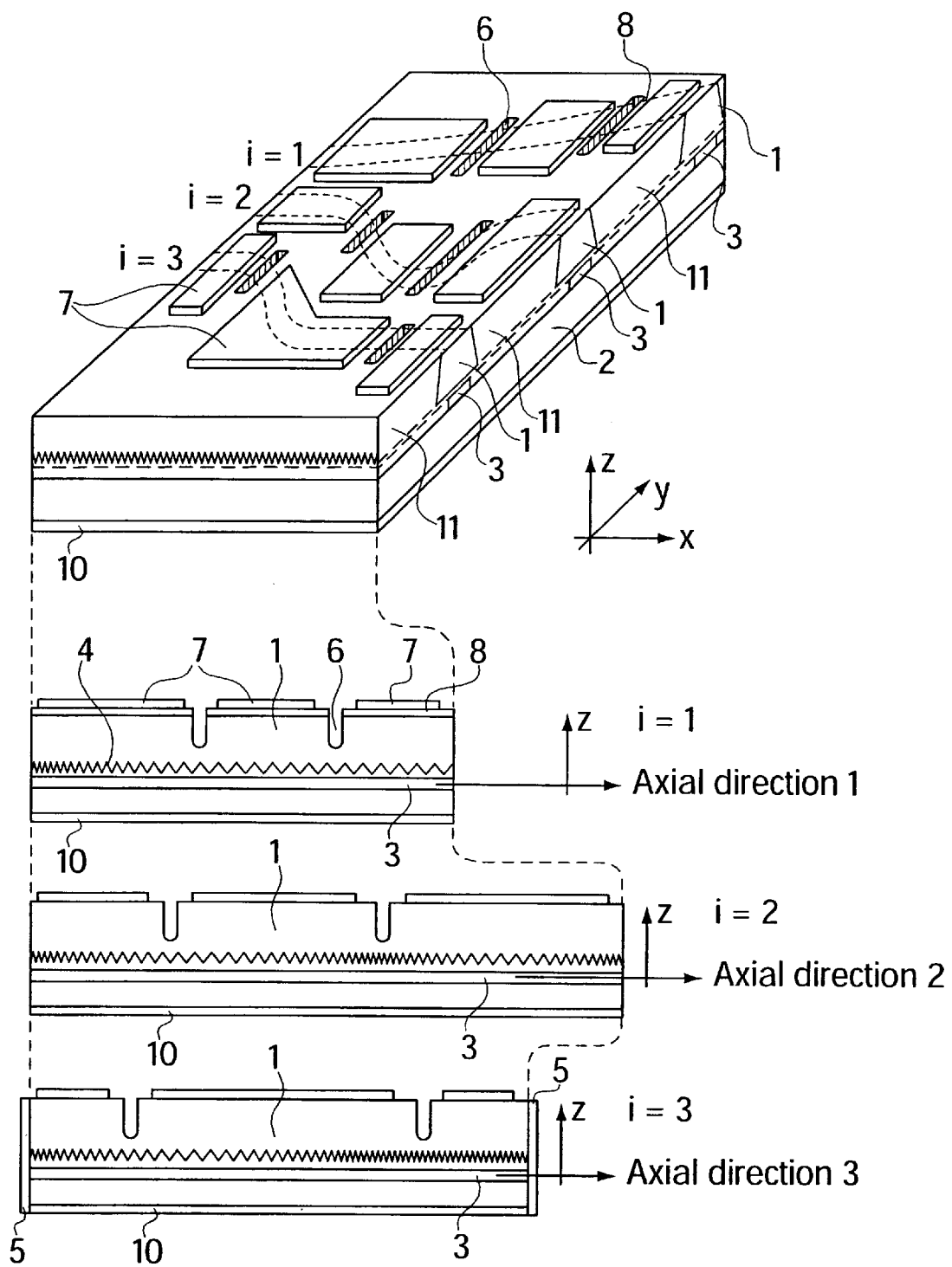
FIG. 11 shows a perspective view as well as three curved sectional views of a ninth embodiment of the present invention including three optical waveguides with each optical waveguide divided twice.

FIG. 11 shows a specific embodiment having three waveguides, each waveguide being divided twice, with the result that there are three 3-section components. This example is based on the example shown in FIG. 1, but it shows possible refinements with regard to active layers 3, as well as with regard to the contacting on the side of bulk semiconductor layer 1 of conductivity type I. In this example, the optical and electronic confinement is implemented by a so-called mushroom structure for each of the three waveguides. The top part of the figure shows, at the right-hand boundary surface, three mushroom structures in cross-section. Material 11 is semi-insulating. In this example, the injection of current into the bent active layers is implemented by way of the correspondingly bent contact strips 8. In this example, charge carriers of conductivity type I flow from a contact pad 7 via contact strip 8 into bulk semiconductor layer 1. From there, these charge carriers are injected into active layer 3.

Following is a first numerical example in which wavelength ranges $\Delta\lambda_1$, $\Delta\lambda_2$, $\Delta\lambda_3$ and $\Delta\lambda_4$ are adjacent in their absolute spectral positions. In this case, the approximately-equal sign in the following is almost an equal sign:

$\alpha_{li,1} < \alpha_{re,1}$; $\alpha_{re,1} \sim \alpha_{li,2}$;
$\alpha_{li,2} < \alpha_{re,2}$; $\alpha_{re,2} \sim \alpha_{li,3}$; $\alpha_{li,3} < \alpha_{re,3}$; $\alpha_{re,3} \sim \alpha_{li,4}$ and
$\alpha_{li,4} < \alpha_{re,4}$.

Furthermore, all the optical waveguides of the component array exhibit a bend, in which $\partial^2 y/\partial x^2 < 0$ (see e.g., FIG. 6). In this case, the effective refractive index is $N_{eff}=3.22785$ and, for reasons of simplicity, is assumed for this example to be wavelength-independent. Furthermore, let the tilt angle of the feedback grating be $\phi=10°$ and let the grating period in the homogeneous feedback grating be $\Lambda_0=237$ nm. The wavelengths $\lambda_{min,i}=2N_{eff}\Lambda_0/\cos\vartheta_{min,i}$ and $\lambda_{max,i}2N_{eff}\Lambda_0/\cos\vartheta_{max,i}$ span the wavelength range $\Delta\lambda_i=\lambda_{max,i}-\lambda_{min,i}$. In this example, $\vartheta_{min,i}$ is the local tilt angle of the optical waveguide relative to feedback grating 4 at position x=0. $\vartheta_{max,i}$ in this example is the local tilt angle of the optical waveguide relative to feedback grating 4 at position x=L.

On this basis, table 1 shows an exemplary embodiment for a laser array having 4 channels.

TABLE 1

| i | $\alpha_{li}$ | $v_{min}$ | $\lambda_{min}(v_{min})$ | $\alpha_{re}$ | $\lambda_{max}$ | $\lambda_{max}(v_{max})$ |
|---|---|---|---|---|---|---|
| 1 | −10° | 0 | 1.53 µm | −4.34° | 5.66° | 1.5375 µm |
| 2 | −4.34° | 5.66° | 1.5375 µm | −2.01° | 7.99° | 1.45 µm |
| 3 | −2.01° | 7.99° | 1.545 µm | −0.23° | 9.77° | 1.525 µm |
| 4 | −0.23° | 9.77° | 1.5525 µm | +1.25° | 11.25° | 1.6 µm |

It is thus revealed that the component array with four multi-section lasers is able to completely cover the range from 1.53 µm to 1.56 µm by wavelength tuning of all four lasers. This example can also be generalized as follows:

1.) Wavelength overlap of the wavelength ranges of the individual channels (e.g. FIG. 8).
2.) No wavelength overlap of the wavelength ranges of the individual channels.
3.) All wavelength ranges A are different and are not, as in this example, equal to 7.5 nm.

Indicated next is a second numerical example corresponding to a further component array with four differently bent optical waveguides. In this example, wavelength ranges $\Delta\lambda_1$, $\Delta\lambda_2$, $\Delta\lambda_3$ and $\Delta\lambda_4$ are not adjacent without gap in their absolute spectral positions. None of the optical waveguides has a point of inflection in the waveguide bending functions. They are all bent in a manner which, in FIG. 7, is qualitatively represented (bending $\delta^2 y/\delta x^2 < 0$).

$\alpha_{li,1}=-4°$; $\alpha_{re,1}=-3.2°$; $\alpha_{li,2}=-2.5°$; $\alpha_{re,2}=-1.1°$; $\alpha_{li,3}=-0.2°$; $\alpha_{re,3}=+0.8°$; $\alpha_{li,4}=1.3°$
and $\alpha_{re,4}=2.9°$.

Next, a third numerical example is described corresponding to a further component array having five differently bent optical waveguides. In this example, wavelength ranges $\Delta\lambda_1$, $\Delta\lambda_2$, $\Delta\lambda_3$, $\Delta\lambda_4$, and $\Delta\lambda_5$ overlap in their absolute spectral positions in some cases, while in other cases, they do not. None of the optical waveguides has a point of inflection in the waveguide bending. They are all bent in a manner which, in FIG. 7, is qualitatively represented (bending functions $\delta^2 y/\delta x^2 < 0$).

$\alpha_{li,1} = -5°$; $\alpha_{re,1} = -4°$; $\alpha_{li,2} = -3.3°$; $\alpha_{re,2} = -1.4°$;
$\alpha_{li,3} = -2.2°$; $\alpha_{re,3} = -0.8°$; $\alpha_{li,4} = 0.1°$; $\alpha_{re,4} = 4.9°$;
$\alpha_{li,5} = 1.3°$ and $\alpha_{re,5} 4.4°$.

The present invention can be employed in photonic components which operate on different waveguide channels and which are based on DFB (distributed feedback) gratings, DBR (distributed Bragg reflector) gratings or axially repeatedly interrupted grating structures ("sampled gratings"). In the latter case, the grating area is composed alternately of grating sections and grating-free areas, it additionally being possible to vary the corresponding lengths in the axial direction. The principle, irrespective of special designs, can be applied to various photonic components if such components are based on optical feedback gratings.

List of reference characters used

1 Bulk semiconductor layer of conductivity type I
2 Bulk semiconductor layer of conductivity type II
3 Active layer
4 Feedback grating
5 Facet coating
6 Isolation trench (contact separation)
7 Contact pads of the individual sections on the side of conductivity type I
8 Contact strips, which follow the waveguide bends, on the side of bulk semiconductor layer 1 of conductivity type I
9 Projection of waveguide center (=axial direction) onto the component surface (parallel to the xy plane)
10 Metallization on the side of conductivity type II
11 Semi-insulating material
φ Tilt angle of the feedback grating
i Ordinal number of the optical waveguide
ϑ Local tilt angle of the optical waveguide
$\Lambda_0$ Grating period in the homogeneous part of the feedback grating
$y_i(x)$ Bending function of the waveguide of ordinal number i
$\alpha_{th}$ Threshold gain
$\Delta\lambda_i$ Wavelength range (wavelength interval)
L Length of the grating section in x-direction
$j_i$ Index of modes of the waveguide of ordinal number i
$\delta^2 y/\delta x^2$ Magnitude and direction of the bending function of the waveguide
$N_{eff}$ Effective refractive index of the optical waveguide
$\alpha_{li,i}$ Angle between the waveguide of ordinal number i and the x-direction at position x=0 (left boundary surface)
$\alpha_{re,i}$ Angle between the waveguide of ordinal number i and the x-direction at position x=L (right boundary surface)
$I_0(x)$ Maximum amount of intensity of the light field conducted in the waveguide at position x
K Coupling coefficient
$\lambda_i$ Emission wavelength of the waveguide of ordinal number i
Index re Reference to right boundary surface
Index li Reference to left boundary surface
$\lambda_{min,i}$ Wavelength of the mode with the smallest wavelength among the modes with the lowest threshold gain of the waveguide with ordinal number i
$\lambda_{max,i}$ Wavelength of the mode with the greatest wavelength among the modes with the lowest threshold gain of the waveguide with ordinal number i
$\Delta\lambda_i$ Wavelength range over which the $m_i$ modes extend

What is claimed is:

1. A wavelength-tunable optoelectronic apparatus comprising:
   a bulk semiconductor layer of conductivity type I;
   a bulk semiconductor layer of conductivity type II;
   at least one optical waveguide, each of the at least one optical waveguide being individually bent in an x–y plane, the x–y plane being defined by an x-axis in an x-direction and a y-axis in a y-direction, each of the at least one optical waveguide defining a respective axial direction;
   at least one active layer including at least one active layer portion, each of the at least one active layer portion being associated with a respective one of the at least one optical waveguide, charge carriers of at least one of conductivity types I and II being injected into at least one of the at least one active layer portion;
   at least one feedback grating having a grating area, the grating area having a length L in the x-direction and including a left and a right boundary surface perpendicular to the x-axis, the left boundary surface being disposed at a left end of the grating area at an x=0 position and the right boundary surface being disposed at a right end of the grating at an x=L position, with respect to the x-axis;
   a contacting arrangement having at least one contacting portion, each of the at least one contacting portion being disposed over an associated one of the at least one optical waveguide and extending discontinuously in a respective plurality of sections in the respective axial direction at a side of the bulk semiconductor layer of conductivity type I, each section of each respective plurality of sections having a respective associated contact pad, the contacting arrangement extending continuously in the respective axial direction at a side of the bulk semiconductor layer of conductivity type II; and
   at least one isolation trench, each of the at least one isolation trench being disposed over a respective at least one of the at least one optical waveguide, each of the at least one isolation trench being disposed between and bounding a respective at least one pair of sections of at least one of the respective plurality of sections of at least one of the at least one contacting portion, a depth, a width, lateral position and a material of each of the at least one isolation trench being dimensioned to provide an ohmic resistance of at least 10 ohms between the respective at least one pair of sections so as to enable each section of each of the respective plurality of sections of the at least one contacting portion to be supplied with an individually adjustable current via the respective associated contact pad;
   when a respective potential of each of the respective associated contact pads is equal to the respective potential of each of the other respective associated contact pads, a respective bending function of each of the at least one optical waveguide being determined by the following conditions:

the respective at least one optical waveguide having at least three spectrally adjacent modes of an index $j_i$, a respective threshold gain of each of the at least three spectrally adjacent modes being lower than other modes of the respective at least one optical waveguide, i being an ordinal number of the respective at least one optical waveguide;

the respective threshold gain $\alpha_{th,ji,i}$ of each of the at least three spectrally adjacent modes differ from each other by no more than 4% of their absolute values, each of the respective threshold gains differing from the other modes of the respective at least one optical waveguide by at least 8%, where $j_i=1,2,\ldots m_i$ $m_i$ being a number of spectrally adjacent modes of the respective at least one optical waveguide of ordinal number i, where $j_i$ is a whole number integer selected from a range of 1 to $m_i$; and a respective spectrum of the at least one optical waveguide having exactly $j_i$ spectrally adjacent modes extending over a respective wavelength range $\Delta\lambda_i=\lambda_{max,i}-\lambda_{min,i}$, $\lambda_{max,i}$ and $\lambda_{min,i}$ being a respective maximum and minimum wavelength of the respective wavelength range $\Delta\lambda_i$, where i is an integer in a first range $1 \leq i \leq n$, n being a number of the at least one optical waveguide;

a total operating wavelength range of the wavelength-tunable optoelectronic apparatus including the respective wavelength range $\Delta\lambda_i$ of each of the at least one optical waveguide, the respective wavelength range of the at least one optical waveguide being describable spectrally by the relationship $|\lambda_{max,k}-\lambda_{min,k+1}|<(\Delta\lambda_k+\Delta\lambda_{k+1})/10$, where k is an integer in a second range $1 \leq k \leq (n-1)$.

2. The wavelength-tunable optoelectronic apparatus as recited in claim 1 wherein the left and the right boundary surfaces of the grating area are respectively coincident with a left and a right boundary of the wavelength-tunable optoelectronic apparatus in the x-axis direction.

3. The wavelength-tunable optoelectronic apparatus as recited in claim 1 wherein at least one of the at least one optical waveguide penetrates at least one of the left and the right boundary surfaces of the grating area and projects outside the grating area at at least one of a position x<0 at the left boundary surface and a position x>L at the right boundary surface.

4. The wavelength-tunable optoelectronic apparatus as recited in claim 1 wherein the grating area is a section of an integrated optoelectronic circuit.

5. The wavelength-tunable optoelectronic apparatus as recited in claim 1 wherein the wavelength ranges from $\Delta\lambda_1$ to $\Delta\lambda_n$ spectrally overlap.

6. The wavelength-tunable optoelectronic apparatus as recited in claim 1 wherein the wavelength ranges from $\Delta\lambda_1$ to $\Delta\lambda_n$ do not spectrally overlap.

7. The wavelength-tunable optoelectronic apparatus as recited in claim 1 wherein the wavelength ranges of selected ones of the at least one optical waveguide spectrally overlap.

8. The wavelength-tunable optoelectronic apparatus as recited in claim 1 wherein an angle $\alpha_{li,i}$ between a one of the at least one optical waveguide having ordinal number i and the x-direction at the left boundary surface and an angle $\alpha_{re,i}$ between the one of the at least one optical waveguide having ordinal number i and the x-direction at the right boundary surface have the following characteristic relations with each other:

$\alpha_{li,1}<\alpha_{re,1}; |\alpha_{re,1}-\alpha_{li,2}|<0.2°$;
from $\alpha_{li,2}<\alpha_{re,2}; |\alpha_{re,2}-\alpha_{li,3}|<0.2°$ to $\alpha_{li,n-1}<\alpha_{re,n-1}; |\alpha_{re,n-1}-\alpha_{li,n}|<0.2°$;
$\alpha_{li,n}<\alpha_{re,n}$.

9. The wavelength-tunable optoelectronic apparatus as recited in claim 1 wherein an angle $\alpha_{li,i}$ between a one of the at least one optical waveguide having ordinal number i and the x-direction at the left boundary surface and an angle $\alpha_{re,i}$ between the one of the at least one optical waveguide having ordinal number i and the x-direction at the right boundary surface have the following characteristic relations with each other:

$\alpha_{li,1}>\alpha_{re,1}; |\alpha_{re,1}-\alpha_{li,2}|<0.2°$;
from $\alpha_{li,2}>\alpha_{re,2}; |\alpha_{re,2}-\alpha_{li,3}|<0.2°$ to $\alpha_{li,n-1}>\alpha_{re,n-1}; |\alpha_{re,n-1}-\alpha_{li,n}|<0.2°$;
$\alpha_{li,n}>\alpha_{re,n}$.

10. The wavelength-tunable optoelectronic apparatus as recited in claim 1 wherein the bulk semiconductor layer of conductivity type I has an N-type conduction and the bulk semiconductor layer of conductivity type II has a P-type conduction.

11. The wavelength-tunable optoelectronic apparatus as recited in claim 1 wherein the bulk semiconductor layer of conductivity type I has a P-type conduction and the bulk semiconductor layer of conductivity type II has an N-type conduction.

12. The wavelength-tunable optoelectronic apparatus as recited in claim 1 wherein a coupling of the at least one feedback grating is complex and includes an index and a gain coupling.

13. The wavelength-tunable optoelectronic apparatus as recited in claim 1 wherein a coupling of the at least one feedback grating is complex and includes an index and a loss coupling.

14. The wavelength-tunable optoelectronic apparatus as recited in claim 1 wherein a coupling of the at least one feedback grating is purely imaginary and includes a loss coupling.

15. The wavelength-tunable optoelectronic apparatus as recited in claim 1 wherein a coupling of the at least one feedback grating is purely imaginary and includes a gain coupling.

16. The wavelength-tunable optoelectronic apparatus as recited in claim 1 wherein a coupling of the at least one feedback grating is real and includes a pure index coupling.

17. The wavelength-tunable optoelectronic apparatus as recited in claim 1 wherein at least one of the at least one optical waveguide is bent arbitrarily so as not to cross another of the at least one optical waveguide.

18. The wavelength-tunable optoelectronic apparatus as recited in claim 1 wherein at least one of the at least one optical waveguide is not bent.

19. The wavelength-tunable optoelectronic apparatus as recited in claim 1 wherein at least one of angles $\phi$, $\vartheta$, $\alpha_{re,i}$ and $\alpha_{li,i}$ are smaller than 20°, $\phi$ being a tilt angle of the at least one feedback grating, $\vartheta$ being a local tilt angle of at least one of the at least one optical waveguides, $\alpha_{li,i}$ being an angle between a one of the at least one optical waveguide having ordinal number i and the x-direction at the left boundary surface and $\alpha_{re,i}$ being an angle between the one of the at least one optical waveguide having ordinal number i and the x-direction at the right boundary surface.

20. The wavelength-tunable optoelectronic apparatus as recited in claim 1 wherein the at least one feedback grating is disposed in an area in which an intensity of a light field conducted in at least one of the at least one optical waveguide is greater than $I_0/100$, $I_0$ being an intensity in a maximum of the light field, a relation $0.2 \leq K \cdot L \leq 7$ applying for a feedback, K being a coupling coefficient.

* * * * *